(12) United States Patent
Sesek et al.

(10) Patent No.: US 7,325,157 B2
(45) Date of Patent: Jan. 29, 2008

(54) MAGNETIC MEMORY DEVICES HAVING SELECTIVE ERROR ENCODING CAPABILITY BASED ON FAULT PROBABILITIES

(75) Inventors: Robert Sesek, Meridian, ID (US); Terrel Munden, Boise, ID (US); Kenneth Kay Smith, Boise, ID (US); Dave McIntyre, Boise, ID (US); Stewart Wyatt, Boise, ID (US)

(73) Assignee: Samsung Electronics Co., Ltd (KR)

( * ) Notice: Subject to any disclaimer, the term of this patent is extended or adjusted under 35 U.S.C. 154(b) by 795 days.

(21) Appl. No.: 10/700,203

(22) Filed: Nov. 3, 2003

(65) Prior Publication Data

US 2005/0094459 A1    May 5, 2005

(51) Int. Cl.
*G06F 11/00* (2006.01)
(52) U.S. Cl. .................... 714/8; 714/723; 714/773
(58) Field of Classification Search .............. 714/6, 714/52, 722, 723, 782, 784
See application file for complete search history.

(56) References Cited

U.S. PATENT DOCUMENTS

| | | | | |
|---|---|---|---|---|
| 3,599,187 A | * | 8/1971 | Bobeck et al. ............. 365/138 |
| 4,216,541 A | * | 8/1980 | Clover et al. ............... 714/764 |
| 5,068,858 A | * | 11/1991 | Blaum et al. ............... 714/774 |
| 5,077,737 A | | 12/1991 | Leger et al. |
| 5,459,742 A | | 10/1995 | Cassidy et al. |
| 5,504,760 A | * | 4/1996 | Harari et al. ............... 714/763 |
| 5,541,938 A | * | 7/1996 | Di Zenzo et al. ........... 714/773 |
| 5,754,753 A | * | 5/1998 | Smelser ....................... 714/8 |
| 5,923,682 A | * | 7/1999 | Seyyedy ....................... 714/773 |
| 6,219,814 B1 | * | 4/2001 | Coker et al. ................ 714/763 |
| 6,523,132 B1 | | 2/2003 | Harari et al. |
| 6,584,543 B2 | * | 6/2003 | Williams et al. ............ 711/105 |
| 6,742,137 B1 | * | 5/2004 | Frey, Jr. ........................ 714/6 |
| 6,961,890 B2 | * | 11/2005 | Smith ............................ 714/763 |
| 7,107,508 B2 | * | 9/2006 | Jedwab et al. ................ 714/763 |
| 7,127,643 B2 | * | 10/2006 | Tremblay et al. ............. 714/52 |
| 7,136,978 B2 | * | 11/2006 | Miura et al. .................. 711/165 |
| 7,187,602 B2 | * | 3/2007 | Wohlfahrt et al. ........... 365/200 |
| 2002/0059539 A1 | * | 5/2002 | Anderson ....................... 714/6 |
| 2003/0023911 A1 | | 1/2003 | Davis et al. |
| 2003/0023922 A1 | | 1/2003 | Davis et al. |
| 2003/0023923 A1 | | 1/2003 | Davis et al. |
| 2003/0023925 A1 | | 1/2003 | Davis et al. |
| 2003/0023927 A1 | | 1/2003 | Davis et al. |
| 2003/0023928 A1 | | 1/2003 | Jedwab et al. |
| 2004/0015748 A1 | * | 1/2004 | Dwyer ............................ 714/52 |

\* cited by examiner

*Primary Examiner*—Gabriel Chu
(74) *Attorney, Agent, or Firm*—Myers Bigel Sibley & Sajovec PA

(57) ABSTRACT

Embodiments of the present invention provide a magnetic memory. In one embodiment, the magnetic memory comprises an array of memory cells and a control circuit. The control circuit is configured to receive data, sort the received data to obtain unchanged data and ECC encoded data, and store the unchanged data and the ECC encoded data in the array of memory cells.

9 Claims, 4 Drawing Sheets

| SECTIONS | FAULTS (PARTS PER MILLION) | ECC |
|---|---|---|
| 1 | 0 | NO ECC |
| 2 | 0 | NO ECC |
| 3 | 8 | RS 132 |
| 4 | 15 | RS 160 |
| 5 | 7 | RS 132 |
| 6 | 0 | NO ECC |
| 7 | 25 | RS 160 |
| 8 | 100 | NOT USABLE |
| ⋮ | ⋮ | ⋮ |

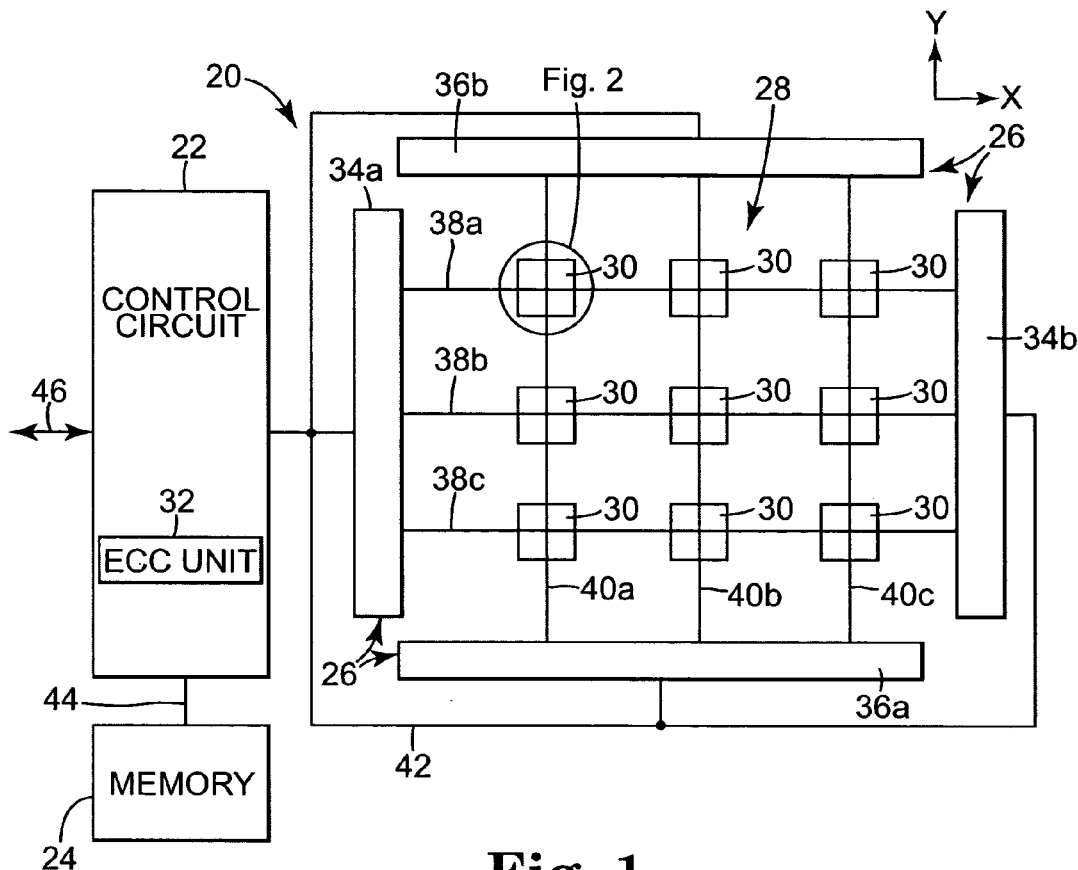
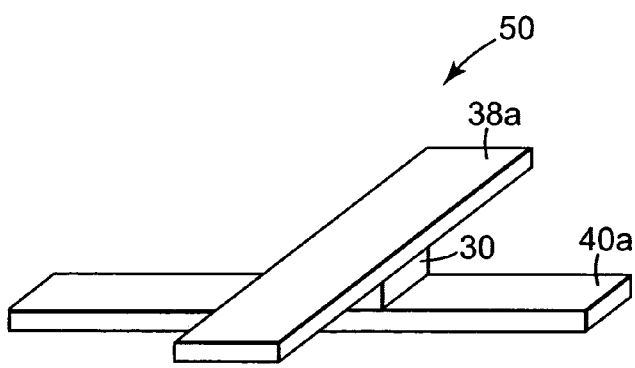
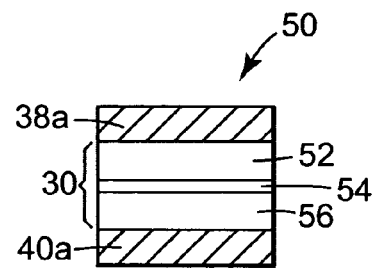
Fig. 1
Fig. 2
Fig. 3

| SECTIONS | FAULTS (PARTS PER MILLION) | NEXT SECTION |
|---|---|---|
| 1 | 0 | 2 |
| 2 | 0 | 6 |
| 3 | 8 | - |
| 4 | 15 | - |
| 5 | 7 | - |
| 6 | 0 | NEXT 0 FAULT SECTION |
| 7 | 25 | - |
| 8 | 100 | - |
| ⋮ | ⋮ | ⋮ |

Fig. 7

| SECTIONS | FAULTS (PARTS PER MILLION) | NUMBER OF ACCESSES | SWAP ADDRESS |
|---|---|---|---|
| 1 | 0 | 1 | 7 |
| 2 | 0 | 5 | |
| 3 | 8 | 6 | |
| 4 | 15 | 7 | |
| 5 | 7 | 8 | |
| 6 | 0 | 9 | |
| 7 | 25 | 56 | 1 |
| 8 | 100 | NA | |
| ⋮ | ⋮ | ⋮ | ⋮ |

Fig. 8

MAGNETIC MEMORY DEVICES HAVING SELECTIVE ERROR ENCODING CAPABILITY BASED ON FAULT PROBABILITIES

BACKGROUND OF THE INVENTION

Electronic memory devices include volatile memory or non-volatile memory. Volatile memory types include dynamic random access memory (DRAM) and static random access memory (SRAM). Non-volatile memory types include reprogrammable memory, such as erasable programmable read only memory (EPROM), electrically erasable programmable read only memory (EEPROM) and FLASH EEPROM memory.

One type of non-volatile, reprogrammable memory known in the art includes magnetic memory cells. These devices, known as magnetic random access memory (MRAM) devices, include an array of magnetic memory cells. The magnetic memory cells may be of different types. For example, the memory cells can be magnetic tunnel junction (MTJ) memory cells or giant magnetoresistive (GMR) memory cells.

Generally, a magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer.

Conductive traces referred to as word lines and bit lines are routed across the array of memory cells. Word lines extend along rows of the memory cells, and bit lines extend along columns of the memory cells. A bit of information is stored in a memory cell as an orientation of magnetization in the sense layer at each intersection of a word line and a bit line. The orientation of magnetization in the sense layer aligns along an axis of the sense layer referred to as its easy axis. Magnetic fields are applied to flip the orientation of magnetization in the sense layer along its easy axis to either a parallel or anti-parallel orientation with respect to the orientation of magnetization in the reference layer.

The word lines and bit lines are routed across the array of memory cells to aid in flipping the orientation of magnetization in sense layers. The word lines extend along rows of the memory cells near the sense layers, and the bit lines extend along columns of the memory cells near the reference layers. The word lines and bit lines are electrically coupled to a write circuit.

During a write operation, the write circuit selects one word line and one bit line to change the orientation of magnetization in the sense layer of the memory cell situated at the conductors crossing point. The write circuit supplies write currents to the selected word line and bit line to create magnetic fields in the selected memory cell. The magnetic fields combine to set or switch the orientation of magnetization in the selected memory cell.

The resistance through a memory cell differs according to the parallel or anti-parallel orientation of magnetization of the sense layer and the reference layer. The resistance is highest when the orientation is anti-parallel, that can be referred to as the logic "1" state, and lowest when the orientation is parallel, that can be referred to as the logic "0" state. The resistive state of the memory cell can be determined by sensing the resistance through the memory cell.

In one configuration, word lines and bit lines aid in sensing the resistance through a memory cell. Word lines are electrically coupled to sense layers and bit lines are electrically coupled to reference layers. Word lines and bit lines are also electrically coupled to a read circuit to sense the resistive state of a memory cell.

During a read operation, the read circuit selects one word line and one bit line to sense the resistance through the memory cell situated at the conductors crossing point. In one type of read operation, the read circuit supplies a constant sense voltage across the selected memory cell to generate a sense current through the memory cell. The sense current through the memory cell is proportional to the resistance through the memory cell and is used to differentiate a high resistive state from a low resistive state.

Although a magnetic memory is generally reliable, failures occur that affect the ability of memory cells to store data. Failures can result from many causes including manufacturing imperfections, internal effects such as noise during a read operation, environmental effects such as temperature and surrounding electromagnetic noise, and aging of the magnetic memory due to use. A memory cell affected by a failure can become unusable such that no logical value can be read from the memory cell or the logical value read from the memory cell is not necessarily the same as the logical value written to the memory cell. The storage capacity and reliability of the magnetic memory can be severely affected and in the worst case the entire magnetic memory becomes unusable.

Some improvements have been made in manufacturing processes and magnetic memory construction to reduce the number of manufacturing failures and improve magnetic memory longevity. However, the improvements usually involve increased manufacturing costs and complexity, and reduced circuit yields. Hence, techniques are being developed to respond to failures and reduce loss of information storage capacity.

SUMMARY OF THE INVENTION

Embodiments of the present invention provide a magnetic memory. In one embodiment, the magnetic memory comprises an array of memory cells and a control circuit. The control circuit is configured to receive data, sort the received data to obtain unchanged data and error correction code encoded data, and store the unchanged data and the error correction code encoded data in the array of memory cells.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 1 is a diagram illustrating an exemplary embodiment of a magnetic memory, according to the present invention.

FIG. 2 is a diagram illustrating an exemplary embodiment of an array section.

FIG. 3 is a diagram illustrating a cross-section of the exemplary embodiment of an array section.

FIG. 7 is a diagram illustrating an exemplary memory map for memory arrays including a sequence of zero fault sections.

FIG. 8 is a diagram illustrating an exemplary memory map for memory arrays including swapping data sections based on the frequency of accessing the data sections.

DETAILED DESCRIPTION

Figure 4:
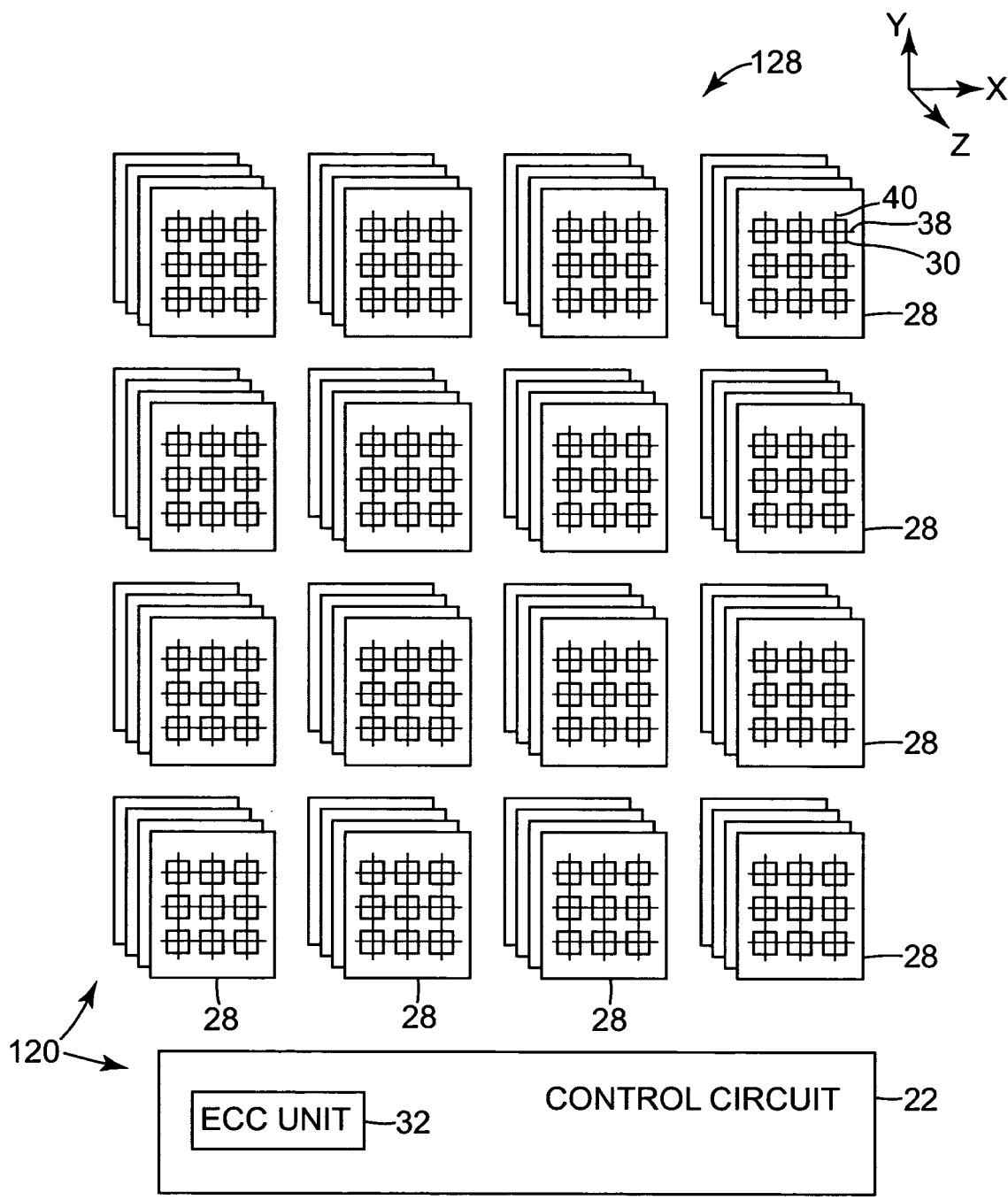
FIG. 4 is a diagram illustrating another magnetic memory, according to the present invention.

FIG. 1 is a diagram illustrating an exemplary embodiment of a magnetic memory 20, according to the present invention. The magnetic memory 20 includes a control circuit 22, memory 24, a read/write circuit 26 and a magnetic memory cell array, indicated at 28. The array 28 includes magnetic memory cells 30, and the control circuit 22 includes an error correction code (ECC) unit 32. The ECC unit 32 encodes and decodes data that is stored in array 28.

In the exemplary embodiment, control circuit 22 organizes the array 28 into data sections. The data sections are divided into groups differentiated by the probability that an error will occur in a data section. Control circuit 22 stores data into a data section group based on predetermined criteria, such as the fault tolerance of the data, speed requirements for accessing the data and the frequency of accessing the data. Some data is written into array 28 as received, that is, without encoding the data. Data written into array 28 as received are referred to herein as unchanged data. Some data is encoded using ECC unit 32 and written into array 28 as encoded data.

The magnetic memory cells 30 are arranged in rows and columns, with the rows extending along an x-direction and the columns extending along a y-direction. Only a relatively small number of memory cells 30 are shown to simplify the illustration of the magnetic memory 20. In practice, arrays of any suitable size can be used and the arrays can be stacked to form 3-dimensional macro-array structures that operate in highly parallel modes.

In the exemplary embodiment, the read/write circuit 26 includes read/write row circuits 34a and 34b, and read/write column circuits 36a and 36b. The row circuits 34a and 34b are electrically coupled to word lines 38a-38c, and the column circuits 36a and 36b are electrically coupled to bit lines 40a-40c. The conductive word lines 38a-38c extend along the x-direction in a plane on one side of array 28, and the conductive bit lines 40a-40c extend along the y-direction in a plane on an opposing side of array 28. There is one word line 38a-38c for each row of the array 28, and one bit line 40a-40c for each column of the array 28. A memory cell 30 is located at each cross-point of a word line 38a-38c and a bit line 40a-40c.

The control circuit 22 is electrically coupled to row circuits 34a and 34b, and column circuits 36a and 36b through conductive read/write paths, indicated at 42. In addition, control circuit 22 is electrically coupled to memory 24 through conductive memory paths 44, and to external sources, i.e., circuits, through conductive input/output (I/O) paths, indicated at 46. The control circuit 22 includes ECC unit 32 to encode and decode data stored in array 28.

Control circuit 22 is a controller that writes data into array 28 and reads data from array 28. The control circuit 22 includes I/O circuits and control logic for communicating with external sources, read/write circuit 26 and memory 24. In addition, control circuit 22 includes non-volatile memory that stores some or the entire operating program for control circuit 22. The operating program can also be stored in memory 24.

Memory 24 is a non-volatile memory that provides zero errors. Memory 24 stores one or more memory maps for array 28. Memory 24 can also store some of the operating program for control circuit 22 or the entire operating program. Memory 24 is a non-volatile memory, such as electrically erasable programmable read only memory (EEPROM) and FLASH EEPROM. In other embodiments, memory 24 can be a different type of non-volatile memory, such as battery backed random access memory (RAM), low fault rate MRAM and zero fault rate portions of an MRAM.

The control circuit 22 controls the read/write circuit 26 to write data into array 28 and read data from array 28. The control circuit 22 receives write addresses and data from external sources through I/O paths 46. The control circuit 22 also receives read addresses from external sources and provides data from array 28 to external sources through I/O paths 46. The control circuit 22, memory 24 and array 28 can be formed on a single substrate or arranged separately. In the exemplary embodiment, control circuit 22, memory 24 and array 28 are formed on the same substrate.

During a write operation, control circuit 22 receives an external write address and data through I/O paths 46. Control circuit 22 evaluates the received data and selects the group of data sections in array 28 to store the received data. Control circuit 22 looks up an array write address within the selected group of data sections and stores the external write address and selected array write address in an address map in memory 24. The address map includes external write addresses and corresponding array write addresses. Control circuit 22 also selects whether the received data is stored as unchanged data or encoded data. The control circuit 22 encodes received data selected to be encoded and provides the selected array write address and either unchanged data or encoded data to read/write circuit 26.

Read/write circuit 26 provides write currents through word lines 38a-38c and bit lines 40a-40c to write memory cells 30 in array 28. Row circuits 34a and 34b provide a first write current through a selected word line 38a-38c, and column circuits 36a and 36b provide a second write current through a selected bit line 40a-40c. The first write current flows from/to row circuit 34a, through the selected word line 38a-38c and to/from row circuit 34b. The second write current flows from/to column circuit 36a, through the selected bit line 40a-40c and to/from column circuit 36b. In the exemplary embodiment, only one read/write circuit 26 is illustrated as coupled to array 28. In practice, any suitable number of read/write circuits are used to read and write the array in a highly parallel fashion. Also, the array of memory cells can include any suitable number of memory cells.

During a write operation, row circuits 34a and 34b select one word line 38a-38c and column circuits 36a and 36b select one bit line 40a-40c to set or switch the orientation of magnetization in the sense layer of the memory cell 30 located at the cross-point of the selected word line 38a-38c and bit line 40a-40c. Row circuits 34a and 34b provide the first write current to the selected word line 38a-38c and column circuits 36a and 36b provide the second write current to the selected bit line 40a-40c. The first write current creates a magnetic field around the selected word line 38a-38c, according to the right hand rule, and the second write current creates a magnetic field around the selected bit line 40a-40c, according to the right hand rule.

The magnetic fields combine to set or switch the orientation of magnetization in the sense layer of the selected memory cell 30.

During a read operation, control circuit 22 receives an external read address through I/O paths 46. Control circuit 22 compares the external read address to external write addresses in the address map stored in memory 24 until a match is found. Control circuit 22 retrieves the array write address corresponding to the matching external write address and provides the array write address to read/write circuit 26. The read/write circuit 26 reads data stored at the array write address location in array 28. Control circuit 22 receives the data read from the array 28 at the array write address location and evaluates whether the data needs to be decoded. In the event the data needs to be decoded, control circuit 22 decodes the data with the ECC unit 32 and provides the decoded data to external sources through I/O paths 46. In the event the data does not need to be decoded, control circuit 22 provides the received data directly to external sources through I/O paths 46.

The read/write circuit 26 selects one word line 38a-38c and one bit line 40a-40c to sense the resistance through the memory cell 30 located at the cross-point of the selected word line 38a-38c and bit line 40a-40c. The row circuit 34a selects a word line 38a-38c, and the column circuit 36a selects a bit line 40a-40c. The row circuit 34a electrically couples the selected word line 38a-38c to ground. The column circuit 36a provides a constant sense voltage on the selected bit line 40a-40c to produce a sense current through the selected memory cell 30. The magnitude of the sense current through the selected memory cell 30 corresponds to the resistive state and the logic state of the selected memory cell 30. The column circuit 36a senses the magnitude of the sense current and provides a logic output signal that indicates the resistive state of the selected memory cell 30. In other embodiments, other suitable read/write circuits can be used to sense the resistive state of the selected memory cell 30. In one suitable read/write circuit, a reference sense current is provided through the selected memory cell 30 and the read/write circuit senses the voltage across the selected memory cell 30 to determine the resistive state of the selected memory cell 30.

FIG. 2 is a diagram illustrating an exemplary embodiment of an array section, indicated at 50. Array section 50 includes a word line 38a, memory cell 30 and a bit line 40a. Memory cell 30 is located between word line 38a and bit line 40a. In the exemplary embodiment, word line 38a and bit line 40a are orthogonal to one another. In other embodiments, word line 38a and bit line 40a can lie in other suitable angular relationships to one another.

In the exemplary embodiment, word line 38a and bit line 40a are electrically coupled to read/write circuit 26. The word line 38a is electrically coupled to row circuits 34a and 34b, and the bit line 40a is electrically coupled to column circuits 36a and 36b. To write memory cell 30, row circuits 34a and 34b provide a first write current to word line 38a and column circuits 36a and 36b provide a second write current to bit line 40a. The first write current through word line 38a creates a magnetic field, according to the right hand rule, around word line 38a and in memory cell 30. The second write current through bit line 40a creates a magnetic field, according to the right hand rule, around the bit line 40a and in memory cell 30. The magnetic fields combine to set or switch the state of memory cell 30.

To read the resistive state and logic state of memory cell 30, row circuit 34a electrically couples word line 38a to ground and column circuit 36a provides a constant sense voltage on bit line 40a. The constant sense voltage across memory cell 30 produces a sense current through memory cell 30 from the bit line 40a to the word line 38a and ground. The magnitude of the sense current indicates the resistive state of memory cell 30. Column circuit 36a senses the magnitude of the sense current and provides an output signal indicative of the resistive state and logic state of memory cell 30.

FIG. 3 is a diagram illustrating a cross section of the exemplary embodiment of array section 50. Array section 50 includes memory cell 30 located between word line 38a and bit line 40a. Memory cell 30 includes a sense layer 52, a spacer layer 54 and a reference layer 56. The spacer layer 54 is located between the sense layer 52 and the reference layer 56. The sense layer 52 is located between the spacer layer 54 and the word line 38a, and the reference layer 56 is located between the spacer layer 54 and the bit line 40a.

The sense layer 52 has an alterable orientation of magnetization and the reference layer 56 has a pinned orientation of magnetization. In the exemplary embodiment, the memory cell 30 is a spin-tunneling device and the spacer layer 54 is an insulating barrier layer through which an electrical charge tunnels during read operations. Electrical charge tunneling through the spacer layer 54 occurs in response to a sense voltage across memory cell 30. The magnitude of the sense current is sensed to determine the state of the memory cell 30. The magnitude of the sense current is smaller with the memory cell 30 in the anti-parallel state and larger with the memory cell 30 in the parallel state. In another embodiment, a giant magnetoresistive (GMR) structure can be used for memory cell 30 and the spacer layer 54 is a conductor, such as copper.

FIG. 4 is a diagram illustrating another magnetic memory 120. The magnetic memory 120 includes a macro-array 128 and control circuit 22. The control circuit 22 includes ECC unit 32. The macro-array 128 includes a large number of magnetic memory cell arrays 28. Each memory cell array 28 includes memory cells 30 that are intersected by word lines 38 and bit lines 40. The arrays 28 are formed and electrically coupled to control circuit 22 as previously described. Using multiple, individual arrays 28 in macro-array 128 makes it possible to have a macro-array 128 with a large overall data storage capacity, without the individual arrays 28 becoming so large that they are difficult to manufacture and control.

The arrays 28 are arranged in rows and columns, with the rows extending along the x-direction and the columns extending along the y-direciton. In addition, the arrays 28 are arranged in stacks that extend along the z-direction. Only a relatively small number of memory cells 30 and arrays 28 are shown to simplify the illustration. In practice, arrays of any suitable size and macro-arrays of any suitable size can be used.

In one suitable 128 M byte macro-array, 1024 arrays are arranged in a macro-array that is 16 arrays high, by 16 arrays wide, with four stack layers. Each individual array is a one M bit array that is 1024 memory cells high by 1024 memory cells wide. Optionally, the magnetic memory comprises more than one such macro-array.

Memory cells in the 128 M byte macro-array are accessed by selecting one word line in each of a plurality of arrays and by selecting multiple bit lines in each of the plurality of arrays. Selecting multiple bit lines in each array, selects multiple memory cells from each array. The accessed memory cells within each of the plurality of arrays correspond to a small portion of a unit of data. Together, the accessed memory cells provide a whole unit of data, such as a sector of 512 bytes or at least a substantial portion of a sector. The memory cells are accessed substantially simultaneously.

In the exemplary embodiment of magnetic memory 120, memory cells 30 are accessed by selecting one word line 38 and multiple bit lines 40 in each of a plurality of arrays 28 to thereby select a plurality of memory cells 30. The accessed memory cells 30 correspond to at least a portion of a unit of data, such as a sector. The plurality of arrays 28 and memory cells 30 can be accessed substantially simultaneously.

Although magnetic memories 20 and 120 are generally reliable, failures can occur that affect the ability of memory cells 30 to store data. Failures can be classified as either systematic failures or random failures. Systematic failures consistently affect a particular memory cell 30 or a particular group of memory cells 30. Random failures occur transiently and are not consistently repeatable. Systematic failures usually arise as a result of manufacturing imperfections and aging. Random failures occur in response to internal and external environmental effects, such as noise during a read process, temperature, and surrounding electromagnetic noise. A memory cell 30 affected by a failure can become unreadable such that no logical value can be read from the memory cell 30 or the logical value read from the memory cell 30 is not necessarily the same as the logical value written to the memory cell 30.

Failure mechanisms take many forms including shorted bits, open bits, half-selected bits and single failed bits. In shorted bits, the resistance through the memory cell 30 is much lower than expected. Shorted bits tend to affect all memory cells 30 lying in the same row and the same column. In open bits, the resistance through the memory cell 30 is much higher than expected. Open bit failures can, but do not always, affect all memory cells 30 lying in the same row or column, or both. Half-selected bit failures occur when writing to a memory cell 30 in a particular row or column causes another memory cell 30 in the same row or column to change state. A memory cell 30 that is vulnerable to a half-select failure will therefore possibly change state in response to writing any memory cell 30 in the same row or column, resulting in unreliable stored data. A single failed bit is where a particular memory cell 30 is fixed in a high resistive or a low resistive state. A single failed bit does not affect other memory cells 30 and is not affected by activity in other memory cells 30.

These four example failure mechanisms are systematic failures, in that the same memory cell(s) 30 are consistently affected. Where the failure mechanism affects only one memory cell 30, it is referred to as an isolated failure. Where the failure mechanism affects a group of memory cells 30 it is referred to as a grouped failure.

While the memory cells 30 can be used to store data according to any suitable logical layout, data is preferably organized into basic sub-units, such as bytes. In turn, the basic sub-units are grouped into larger logical data units, such as sectors. A physical failure, and in particular a group failure affecting many memory cells 30 can affect many bytes and possibly many sectors. A single physical failure can potentially affect a large number of logical data units, such that avoiding use of all bytes, sectors or other units affected by failures substantially reduces the storage capacity of the magnetic memory 20 and 120. For example, a grouped failure such as a shorted bit failure in just one memory cell 30 affects many other memory cells 30 that lie in the same row or the same column. A single shorted bit failure can affect over 1000 other memory cells 30 lying in the same row, and over 1000 memory cells 30 lying in the same column. The affected memory cells 30 may be part of many bytes and many sectors. Not using the affected bytes and sectors reduces the storage capacity of the magnetic memory 20 and 120.

In the exemplary embodiment, some or all of the affected bytes and sectors are used for storing data. The data is encoded with an ECC scheme and stored as ECC encoded data in the arrays 28. Error correction coding involves receiving original data for storage and forming ECC encoded data that allows errors to be identified and ideally corrected. The ECC encoded data is stored in the arrays 28 of magnetic memory 20 and 120. During read operations, the original data is recovered by error correction decoding the ECC encoded stored data. A wide range of ECC schemes are available and can be employed alone or in combination. Suitable ECC schemes include schemes with single-bit symbols, such as Bose-Chaudhuri-Hocquenghen (BCH) schemes, and schemes with multiple-bit symbols, such as Reed-Solomon schemes.

In another embodiment, some of the affected bytes and sectors are used for storing data that is fault tolerant data. The fault tolerant data does not have to be stored and retrieved without error, such as video stream data and audio data.

Figures 5, 6:
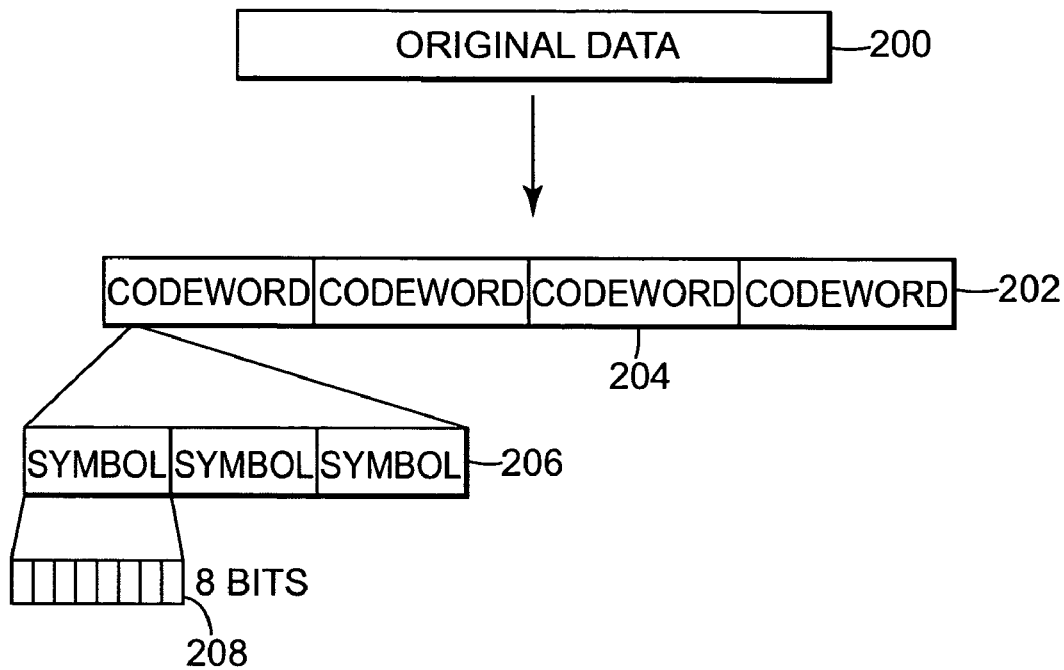
FIG. 5 is a diagram illustrating an exemplary logical data structure for storing ECC encoded data in a magnetic memory.
FIG. 6 is a diagram illustrating an exemplary memory map for memory arrays organized into data sections.

FIG. 5 is a diagram illustrating an exemplary logical data structure for storing ECC encoded data in magnetic memories 20 and 120. Original data is received by control circuit 22 in predetermined units, such as an original data sector comprising 512 bytes, indicated at 200. Control circuit 22 controls ECC unit 32 to encode the received original data sector 200 and produce ECC encoded data. The original data sector 200 is encoded into an ECC encoded sector, indicated at 202.

The ECC encoded sector 202 comprises a plurality of symbols 206. Each symbol 206 can be a single bit (e.g. a BCH code with single-bit symbols) or can comprise multiple bits (e.g. a Reed-Solomon code using multiple-bit symbols). In the exemplary embodiment, a Reed-Solomon coding scheme is used where each symbol 206 comprises 8 bits, indicated at 208. The encoded sector 202 comprises 4 codewords 204, each comprising on the order of 132 to 160 symbols. The 8 bits corresponding to each symbol are stored in 8 memory cells 30 and can be termed a symbol group. A physical failure that directly or indirectly affects any of these 8 memory cells 30 in a symbol group can result in one or more of the bits being unreliable or unreadable giving a failed symbol.

Each block of stored ECC encoded data is read from the memory cells 30 and received by control circuit 22. The control circuit 22 controls ECC unit 32 to decode the ECC encoded data and identify and correct failed symbols 206. Decoding is performed independently for each block of ECC encoded data, such as an ECC encoded sector 202 or for each ECC codeword 204. In the exemplary embodiment, the encoded sector 202, or preferably each ECC codeword 204, forms the block of ECC encoded data to be stored in magnetic memories 20 and 120.

Control circuit 22 and ECC unit 32 provide Reed-Solomon ECC schemes to encode received original data 200. The Reed-Solomon schemes are examples of a linear error correcting code that mathematically identifies and corrects completely up to a predetermined maximum number of failed symbols 206 within each independently decodable block of ECC encoded data, depending upon the correction capability (power) of the code. For example, a [160, 128, 32] Reed-Solomon code producing codewords 204 having one hundred and sixty 8-bit symbols corresponding to one hundred and twenty eight original data bytes and a minimum distance of thirty two symbols can locate and correct up to sixteen random symbol errors in one hundred and sixty bytes. In another example a [132, 128, 4] Reed-Solomon code producing codewords 204 having one hundred and thirty two 8-bit symbols corresponding to one hundred and twenty eight original information bytes and a minimum distance of four symbols can locate and correct up to two random symbol errors in one hundred and thirty two bytes.

The ECC scheme employed is selected with a correction capability sufficient to recover original data 200 from the encoded data in substantially all cases. ECC encoding and decoding of data takes time and uses power. ECC schemes with a higher correction capability take more time and use more power relative to lower correction capability ECC schemes. In the exemplary embodiment, the [160, 128, 32] Reed-Solomon code has a higher correction capability and takes more time and power than the [132, 128, 4] Reed-Solomon code. Original data 200 that is received by control circuit 22 and stored in memory cells 30 as unchanged data is written to and read from magnetic memories 20 and 120 faster than data that is ECC encoded and decoded.

FIG. 6 is a diagram illustrating an exemplary memory map 300 for memory arrays 28 and 128 organized into data sections numbered 1-8 and on, indicated at 302. The control circuit 22 logically organizes the arrays 28 and 128 into data sections 302. The data sections 302 can be any suitable size and in the exemplary embodiment, each section 302 is a sector of 512 bytes.

Control circuit 22 evaluates each section 302 to calculate the probability of a fault in each section 302, indicated at 304. In addition, control circuit 22 assigns each section 302 one of the ECC schemes or no ECC scheme, indicated at 306. The memory map 300 is stored in memory 24 and maintained by control circuit 22.

The control circuit 22 evaluates each section 302 to calculate the probability of a fault in each section 302. Control circuit 22 executes an evaluation program to test all memory cells 30 in a selected section 302. In other embodiments, the evaluation program can test a smaller percentage of the memory cells 30 in a selected section 302, such as 50% of the memory cells 30. The evaluation program is executed by control circuit 22 at any suitable time and in the exemplary embodiment, the evaluation program is executed at boot-up and as a background task, when the arrays 28 and 128 are not being written to or read from by external sources.

Control circuit 22 evaluates a section 302 by writing the memory cells 30 in the selected section 302 to a parallel state and reading the memory cells 30, and writing the memory cells 30 to an anti-parallel state and reading the memory cells 30. In the event a memory cell 30 does not provide an expected logic state, control circuit 22 counts the memory cell 30 as a faulty memory cell 30. After all memory cells 30 in a section 302 are evaluated, control circuit 22 calculates the probability of a fault occurring in the section 302. The fault probability 304 for the section 302 is recorded in parts per million. A change in the fault probability 304 for a section 302 can be updated in memory map 300 by control circuit 22 prior to a write operation to the section 302.

Control circuit 22 assigns an ECC scheme (or no ECC scheme) 306 to each section 302 based on the fault probability 304 for the section 302. The ECC scheme 306 for each section 302 is recorded in memory map 300 and stored in memory 24. Control circuit 22 references the memory map 300 and ECC scheme 306 to write data into and read data from the sections 302.

Control circuit 22 evaluates the sections 302 and calculates the fault probability 304 for each section 302. The sections 302 are categorized as zero fault sections, usable fault sections and not usable fault sections. A zero fault section is a section 302 having a fault probability of zero parts per million or so close to zero parts per million that the fault probability is rounded to zero. Control circuit 22 does not need to ECC encode and decode data stored in the zero fault sections. Data stored and retrieved from the zero fault sections are assumed to be accurate. Control circuit 22 stores a no ECC indication in memory map 300 at 306 to indicate that no ECC scheme is needed to write data into and read data from the sections 302 that are zero fault sections.

A usable fault section is a section 302 having a fault probability within a usable range of fault probabilities in parts per million. In one example range, usable fault sections have a fault probability between zero and 100 parts per million. A usable fault section is assigned an ECC scheme to write data into and read data from the section. Any suitable number of ECC schemes and any suitable type of ECC scheme can be used to encode and decode data for the usable fault sections. In the exemplary embodiment, two Reed-Solomon ECC schemes are used to store data in the usable fault sections.

Each usable fault section is assigned one of two ECC schemes. The assigned ECC scheme is used to encode and decode data stored in the corresponding usable fault section. The two ECC schemes are the Reed-Solomon [132, 128, 4] scheme and the Reed-Solomon [160, 128, 32] scheme. The Reed-Solomon [132, 128, 4] scheme corrects two random errors in 132 bytes, and is referred to herein as RS 132. The Reed-Solomon [160, 128, 32] corrects 16 random errors in 160 bytes and is referred to herein as RS 160. Each of the ECC schemes take time and power for encoding and decoding data stored in arrays 28 and 128. RS 132 is an ECC scheme that has a lower correction capability and is faster and takes less power than the RS 160 scheme that has a higher correction capability. The usable fault sections are assigned an ECC scheme based on the fault probability 304 of the section 302 and the need to correct all faults, if possible, in the shortest amount of time.

In the exemplary embodiment, the useable fault sections are assigned the RS 132 or RS 160 ECC scheme. Sections 302 that have fault probabilities 304 between zero and 10 parts per million are assigned the faster RS 132 ECC scheme that has a lower correction capability, i.e. is less powerful. Sections 302 that have fault probabilities from 10 to 100 parts per million are assigned the slower RS 160 ECC scheme that has a higher correction capability, i.e. is more powerful. Control circuit 22 encodes and decodes data stored in the usable fault sections using the assigned ECC scheme.

Sections 302 that have a fault probability greater than a certain threshold value are recorded as not usable fault sections. In the exemplary embodiment, not usable fault sections are sections 302 that have a fault probability of 100 parts per million or more. Control circuit 22 writes memory map 300 at 306 to indicate which sections 302 are not usable fault sections.

The not usable fault sections are remapped to spare zero fault sections and usable fault sections in a process referred to as sparing. In sparing, memory addresses that are not useable are remapped to spare usable memory addresses. The spare usable memory addresses can be expressly set aside for the purpose of sparing out other memory addresses. Control circuit 22 maintains the address map in memory 24 that relates external addresses to internal array write addresses used for storing data in arrays 28 and 128, including spare usable addresses as array write addresses.

Memory map 300 includes sections 302 that are numbered 1-8 and on. By way of example, sections 1, 2 and 6 are illustrated as having a fault probability 304 of zero parts per million. Sections 1, 2 and 6 are zero fault sections. Data stored in sections 1, 2 and 6 are not encoded and decoded with an ECC scheme. Control circuit 22 receives original data and writes the original data as unchanged data into sections 1, 2 and 6.

Sections 3, 4, 5 and 7 are usable fault sections. Sections 3, 4, 5 and 7 are sections that have a fault probability 304 between zero and 100 parts per million. Sections 3 and 5 have fault probabilities 304 between zero and 10 parts per million and are assigned the RS 132 ECC scheme. The RS 132 ECC scheme corrects 2 random errors in 132 bytes of data in sections 3 and 5. The RS 132 scheme is faster and consumes less power than the RS 160 scheme. Control circuit 22 references memory map 300 and controls ECC unit 32 to encode data using the RS 132 ECC scheme to store ECC encoded data in sections 3 and 5. Data read from sections 3 and 5 are decoded using the same RS 132 ECC scheme. Control circuit 22 writes memory map 300 at 306 to record that the RS 132 scheme is used to read and write data in sections 3 and 5.

Sections 4 and 7 have fault probabilities 304 between 10 and 100 parts per million and are assigned the RS 160 ECC scheme that has a higher correction capability. The RS 160 ECC scheme corrects 16 random errors in 160 bytes of data stored in sections 4 and 7. Control circuit 22 references memory map 300 and controls ECC unit 32 to encode data using the RS 160 ECC scheme to store encoded data in sections 4 and 7. The RS 160 ECC scheme is also used to decode data retrieved from sections 4 and 7. Control circuit 22 writes memory map 300 at 306 to indicate that the RS 160 scheme is used to read and write data in sections 4 and 7.

Section 8 has a fault probability 304 of 100 parts per million. A section 302 with a fault probability 304 that is equal to or greater than 100 parts per million is a not usable fault section, also referred to herein as a heavy fault section. The heavy fault sections are not used and are remapped to spare zero fault sections and usable fault sections. Control circuit 22 writes memory map 300 at 306 to indicate that section 8 is not usable.

Zero fault sections, including sections 1, 2 and 6, are written to and read from faster and using less power as compared to accessing usable fault sections. Data is written to and read from the zero fault sections of arrays 28 and 128 as unchanged original data. Usable fault sections that are assigned the RS 132 ECC scheme are accessed slower and using more power as compared to accessing the zero fault sections, but faster and using less power as compared to accessing the usable fault sections assigned the RS 160 ECC scheme. Usable fault sections assigned the RS 160 ECC scheme are accessed the slowest and using the most power.

Control circuit 22 controls reading data from arrays 28 and 128. In one type of read operation, control circuit 22 provides a single sense read operation through a memory cell 30 to sense the resistance and the state of the selected memory cell 30. The logic states of the selected memory cell 30 are obtained from the single sense operation. The selected memory cell 30 is not written to a different state during the read operation, and the single sense read operation is referred to as a non-destructive read operation.

In another type of read operation, the control circuit 22 provides multiple sense and multiple write operations to read the state of a selected memory cell 30. In one example multiple sense read operation, the resistance through a memory cell 30 is sensed in a first sense operation. The memory cell 30 is written to a logic state, such as logic "1", and a second sense operation is performed. The memory cell 30 is written to the other logic state, such as logic "0", and a third sense operation is performed. The three sense results are compared to determine the original logic state of the memory cell 30. Control circuit 22 writes the memory cell 30 back to the determined logic state in a third write operation. Since the memory cell 30 is written to different logic states during the read operation, the multiple sense and multiple write read operation is referred to as a destructive read operation. More reliable read results can be obtained using the destructive read operation as compared to the non-destructive read operation. However, the non-destructive read operation is faster and uses less power than the destructive read operation.

In the exemplary embodiment, non-destructive read operations are used to read data from the zero fault sections. The memory cells 30 in the zero fault sections are very reliable and destructive read operations are not used. Using non-destructive read operations to read zero fault sections results in zero fault section access times remaining the fastest and lowest power accesses.

Destructive read operations are used to read data from the usable fault sections. The memory cells 30 in the usable fault sections provide more faults. The destructive read operations are used to improve results. The destructive read operations slow the read access times and increase the power used for accessing usable fault sections. In other embodiments, destructive read operations are used to access both zero fault sections and usable fault sections. In other embodiments, non-destructive read operations can be used to access both zero fault sections and usable fault sections.

In another aspect of the exemplary embodiment, fault tolerant data and fault intolerant data are stored in arrays 28 and 128. Fault tolerant data does not have to be stored and recovered exactly as received. Fault tolerant data includes data, such as video streaming data and audio data. Fault intolerant data is data that needs to be stored and recovered exactly as received or with the fewest number of faults. Fault intolerant data includes data, such as indexes, digital still images and accounting files.

In the exemplary embodiment, fault intolerant data is stored in the zero fault sections as unchanged data and the usable fault sections as ECC encoded data. The zero fault sections produce very few, if any, faults and the usable fault sections store ECC encoded data that is, ideally, corrected to be exactly as the received original data. The fault tolerant data is also stored in the zero fault sections and the usable fault sections. Fault tolerant data stored in zero fault sections are stored as unchanged data and fault tolerant data stored in usable fault sections is stored as ECC encoded data. In other embodiments, fault tolerant data is stored in the usable fault sections as unchanged data.

In another embodiment, control circuit 22 organizes the arrays 28 and 128 into sections 302 and calculates fault probabilities 304, as previously described. However, ECC schemes are not employed to store data in the arrays 28 and 128. Instead, original data is divided into fault tolerant data and non-fault tolerant data, referred to herein as fault intolerant data. The fault tolerant data is stored as unchanged data in the usable fault sections and the fault intolerant data is stored as unchanged data in the zero fault sections. The data is read from both the zero fault sections and usable fault sections using destructive read operations to improve results. Accessing data in the zero fault sections and the usable fault sections takes the same amount of time and uses the same amount of power. In other embodiments, non-destructive read operations are used to read zero fault sections and destructive read operations are used to read usable fault sections. The different types of read operations change the access times slightly for the zero fault sections and usable fault sections. In another embodiment, non-destructive read operations can be used for zero fault sections and usable fault sections.

FIG. 7 is a diagram illustrating an exemplary memory map 400 for memory arrays 28 and 128, including a sequence of zero fault sections. Memory map 400 includes data sections numbered 1-8 and on, indicated at 402. The data sections 402 can be any suitable size and in the exemplary embodiment, each data section 402 is a sector of 512 bytes. The control circuit 22 organizes the arrays 28 and 128 into data sections 402 that are similar to data sections 302.

Control circuit 22 evaluates each data section 402 to calculate the probability of a fault in each section 402, indicated at 404. The fault probability evaluation of each section 402 is similar to the fault probability evaluation of each section 302. In the exemplary embodiment, data sections 402 and fault probabilities 404 are similar to data sections 302 and fault probabilities 304. In addition, memory map 400 can be combined with memory map 300 and stored in memory 24. The memory map 400 is stored in memory 24 and maintained by control circuit 22.

Control circuit 22 provides next section pointers, indicated at 406, to create a sequence of zero fault sections. Each zero fault section is assigned a next section pointer 406 that points to another zero fault section in arrays 28 and 128. Control circuit 22 continuously evaluates the sections 402 to identify zero fault sections and usable fault sections. Control circuit 22 organizes the zero fault sections at 406 into a sequence for sequential access of zero fault sections in arrays 28 and 128.

In the exemplary embodiment, control circuit 22 does not ECC encode data stored in the zero fault sections. In addition, data is read from the zero fault sections in non-destructive, single sense read operations. Data access time values for the zero fault sections are the fastest and least power consuming of all data accesses in arrays 28 and 128. The zero fault sections are sequenced to make a fast, pseudo-random access memory that can store data across section boundaries. The next section pointers 406 point to the next zero fault section in the sequence for storing and reading data.

In one example sequence, section 1 is a zero fault section and the beginning of a zero fault section sequence. The next section pointer 406 for section 1 points to section 2. In turn, the next section pointer 406 for section 2 points to section 6 and so on, with each next section pointer 406 pointing to the next zero fault section in arrays 28 and 128. In the event control circuit 22 identifies a new zero fault section, the sequence is continued from the last zero fault section to the new zero fault section.

FIG. 8 is a diagram illustrating an exemplary memory map 500 for memory arrays 28 and 128, including swapping data sections 502 based on the frequency of accessing the data sections 502. Memory map 500 includes data sections numbered 1-8 and on, indicated at 502. The data sections 502 can be any suitable size and in the exemplary embodiment, each data section 502 is a sector of 512 bytes. The control circuit 22 organizes the arrays 28 and 128 into data sections 502 that are similar to data sections 302 and 402.

Control circuit 22 evaluates each data section 502 to calculate the probability of a fault in each section 502, indicated at 504. The fault probability evaluation of each section 502 is similar to the fault probability evaluation of each section 302 and 402. In the exemplary embodiment, data sections 502 and fault probabilities 504 are similar to data sections 302 and 402 and fault probabilities 304 and 404. In addition, memory map 500 can be combined with memory maps 300 and 400 and stored in memory 24. The memory map 500 is stored in memory 24 and maintained by control circuit 22.

Control circuit 22 counts the number of times a section 502 is accessed during a given time period and stores the number in memory map 500 as the number of accesses, indicated at 506. The number of accesses 506 indicates the frequency of accessing the section 502. Control circuit 22 counts the number of accesses 506 for a selected section 502 during a predetermined time period, such as 5 or 10 seconds, and periodically updates the number of accesses 506 in memory map 500.

The swap address 508 is a pointer that points to another section 502 in arrays 28 and 128. The swap address 508 for a first section 502 points to a second section 502 that stores the data from the first section 502. The swap address for the second section 502 can be, but does not have to be, the first section 502.

Control circuit 22 evaluates the number of accesses 506 to select sections 502 for swapping. In the event the number of accesses 506 for a first section exceeds a predetermined threshold value, control circuit 22 swaps the first section with a second section. Where accesses to the second section are higher speed and lower power accesses and provided the number of accesses 506 for the second section do not exceed a threshold value for the second section. The sections 502 have different access times and power consumption based on whether or not they store data as unchanged data or ECC encoded data. Also, the type of ECC scheme used to store data in a section 502 determines the speed and power used to write data to and read data from the section 502. A section 502 that has slow, high power consumption accesses and exceeds a threshold value for the number of accesses 506 can be swapped with a section 502 that has faster, lower power consumption accesses and does not exceed a threshold value for number of accesses 506. A section 502 that has the fastest and lowest power consumption accesses and exceeds a threshold value for number of accesses 506 is not swapped with any sections 502.

In the exemplary embodiment, the sections 502 are organized into zero fault sections that store unchanged data, usable fault sections that store data encoded with the RS 132 ECC scheme and usable faults sections that store data encoded with the RS 160 ECC scheme. The zero fault sections are accessed the fastest and with the least amount of power, followed by the usable fault sections that store data encoded with the RS 132 ECC scheme. The usable fault sections that store data encoded with the RS 160 ECC scheme are accessed the slowest and with the highest power consumption.

The usable fault sections that store data encoded with the RS 160 ECC scheme and exceed an RS 160 threshold value for number of accesses 506 can be swapped with usable fault sections that store data encoded with the RS 132 ECC scheme and do not exceed an RS 132 threshold value for number of accesses 506. The usable fault sections that store data encoded with the RS 160 ECC scheme can also be swapped with the zero fault sections that do not exceed a zero fault threshold value for number of accesses 506. The usable fault sections that store data encoded with the RS 132 ECC scheme and exceed the RS 132 threshold value for number of accesses 506 can be swapped with zero fault sections that do not exceed the zero fault threshold value for number of accesses 506. The RS 160, RS 132 and zero fault threshold values for number of accesses 506 can be the same or different. In the exemplary embodiment, all three thresholds values are the same, such as 40 or 50 accesses in 5 seconds.

In an example of swapping sections 502, sections 1, 2 and 6 are zero fault sections that store received original data as unchanged data. Sections 3 and 5 store data encoded with the RS 132 ECC scheme and sections 4 and 7 store data encoded with the RS 160 ECC scheme. The threshold values for the number of accesses 506 are set at 50. The number of accesses 506 for sections 1-6 are each less than 10. However, the number of accesses 506 for section 7 stands at 56 and exceeds the threshold value of 50. Control circuit 22 evaluates the number of accesses 506 for each section 502 and swaps section 7 with section 1.

Section 7 is a usable fault section that stores data encoded with the RS 160 ECC scheme. The RS 160 ECC scheme is the slowest and consumes the most power. Section 1 is a zero fault section that stores received original data as unchanged data. The data from section 7 is decoded and stored in section 1 as unchanged data. Subsequent reads and writes that would have been with section 7 are mapped to section 1. The data from section 1 is encoded with ECC unit 32 and the RS 160 ECC scheme, and stored in section 7. Subsequent reads and writes that would have been with section 1 are mapped to section 7 and the data is encoded with the RS 160 ECC scheme.

The exemplary embodiment includes selective ECC encoding and decoding, zero fault section sequencing and address swapping. In other embodiments, each of these techniques can be done individually or in any combination. Also, the number of ECC schemes is not limited to 2. In other embodiments, 1, 2, 3 or more ECC schemes can be used or ECC encoding and decoding does not need to be used, such as in storing fault tolerant and fault intolerant data as unchanged data.

What is claimed is:

1. An integrated circuit memory device, comprising:
at least one array of magnetic memory cells; and
a control circuit configured to organize the at least one array of magnetic memory cells into zero fault sections and usable fault sections, and store data without ECC encoding in the zero fault sections and data with ECC encoding in the usable fault sections.

2. An integrated circuit memory device, comprising:
at least one array of magnetic memory cells; and
a control circuit configured to organize the at least one array of magnetic memory cells into sections comprising zero fault sections and further configured to sort received data to thereby identify fault intolerant data to be stored in the zero fault sections.

3. An integrated circuit memory device, comprising:
at least one array of magnetic memory cells; and
a control circuit configured to organize the at least one array of magnetic memory cells into zero fault sections, usable fault sections and heavy fault sections that are remapped into the zero fault sections and the usable fault sections.

4. An integrated circuit memory device, comprising:
at least one array of magnetic memory cells; and
a control circuit configured to organize the at least one array of magnetic memory cells into zero fault sections and usable fault sections and swap usable fault sections with zero fault sections based on number of accesses during a predetermined period.

5. A magnetic memory, comprising:
an array of magnetic memory cells; and
a control circuit configured to divide the array of magnetic memory cells into zero fault sections and usable fault sections, receive data and sort the received data into the zero fault sections and usable fault sections based on predetermined criteria, said control circuit further configured to provide destructive reads in the zero fault sections and the usable fault sections.

6. A magnetic memory, comprising:
an array of magnetic memory cells; and
a control circuit configured to divide the array of magnetic memory cells into zero fault sections and usable fault sections, receive data and sort the received data into the zero fault sections and usable fault sections based on predetermined criteria, said control circuit further configured to provide non-destructive reads in the zero fault sections.

7. An integrated circuit device, comprising:
at least one array of non-volatile memory cells; and
a control circuit configured to test said at least one array of non-volatile memory cells to identify at least one zero fault section of non-volatile memory cells that is free of memory cell defects and at least another usable fault section of non-volatile memory cells that has memory cell defects, said control circuit further configured to selectively store first data without ECC encoding in the at least one zero fault section of non-volatile memory cells and store second data with ECC encoding in the at least another usable fault section of non-volatile memory cells.

8. The integrated circuit device of claim 7, wherein said control circuit is further configured to utilize multiple different ECC encoding schemes when storing second data in the at least another usable fault section of non-volatile memory cells.

9. The integrated circuit device of claim 8, wherein said control circuit selects among the different ECC encoding schemes based on fault probabilities associated with the non-volatile memory cells within the at least another usable fault section of non-volatile memory cells.

* * * * *